United States Patent [19]

Grabbe

[11] Patent Number: 4,642,889
[45] Date of Patent: Feb. 17, 1987

[54] COMPLIANT INTERCONNECTION AND METHOD THEREFOR

[75] Inventor: Dimitry G. Grabbe, Middletown, Pa.

[73] Assignee: AMP Incorporated, Harrisburg, Pa.

[21] Appl. No.: 728,065

[22] Filed: Apr. 29, 1985

[51] Int. Cl.⁴ .......................... H05K 3/34; H05K 7/00
[52] U.S. Cl. ...................................... 29/840; 361/403;
361/413; 174/68.5; 339/275 B
[58] Field of Search .......................... 174/52 FP, 68.5;
29/840; 357/80, 81; 339/17 B, 275 B; 361/403,
404, 405, 406, 413; 204/19

[56] References Cited

U.S. PATENT DOCUMENTS

| | | | |
|---|---|---|---|
| 3,429,040 | 2/1969 | Miller | 29/840 |
| 3,591,839 | 7/1971 | Evans | 174/68.5 X |
| 4,034,468 | 7/1977 | Koopman | 29/825 |
| 4,080,722 | 3/1978 | Klatskin et al. | 204/15 X |
| 4,231,154 | 11/1980 | Gazdik et al. | 29/840 |

OTHER PUBLICATIONS

IBM Tech. Discl. Bulletin, vol. 27, No. 8, Jan. 1985, p. 4855.

Primary Examiner—Howard N. Goldberg
Assistant Examiner—Carl J. Arbes
Attorney, Agent, or Firm—Bruce J. Wolstoncroft; Donald M. Boles

[57] ABSTRACT

A method and device for compliantly interconnecting a surface mount device or the like to a circuit board is taught. Briefly stated, an interposer having interconnect areas is placed between the circuit board and the device to be surface mounted with interconnect areas disposed between conductive strips on the circuit board and pads contained on the surface mount device. The interconnect area has disposed therein a plurality of fine wires having flux and solder disposed thereon.

9 Claims, 10 Drawing Figures

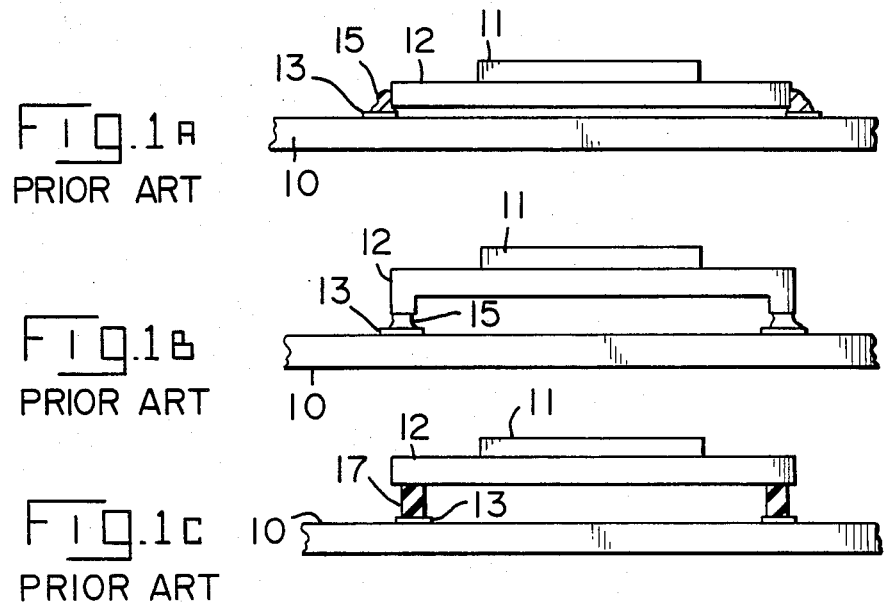
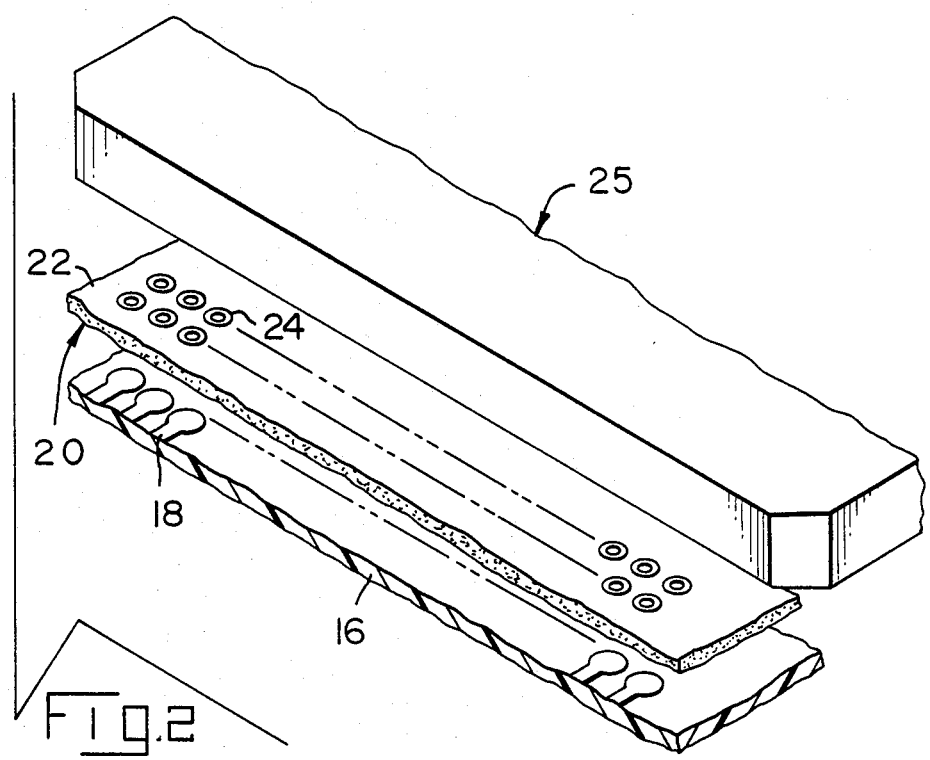

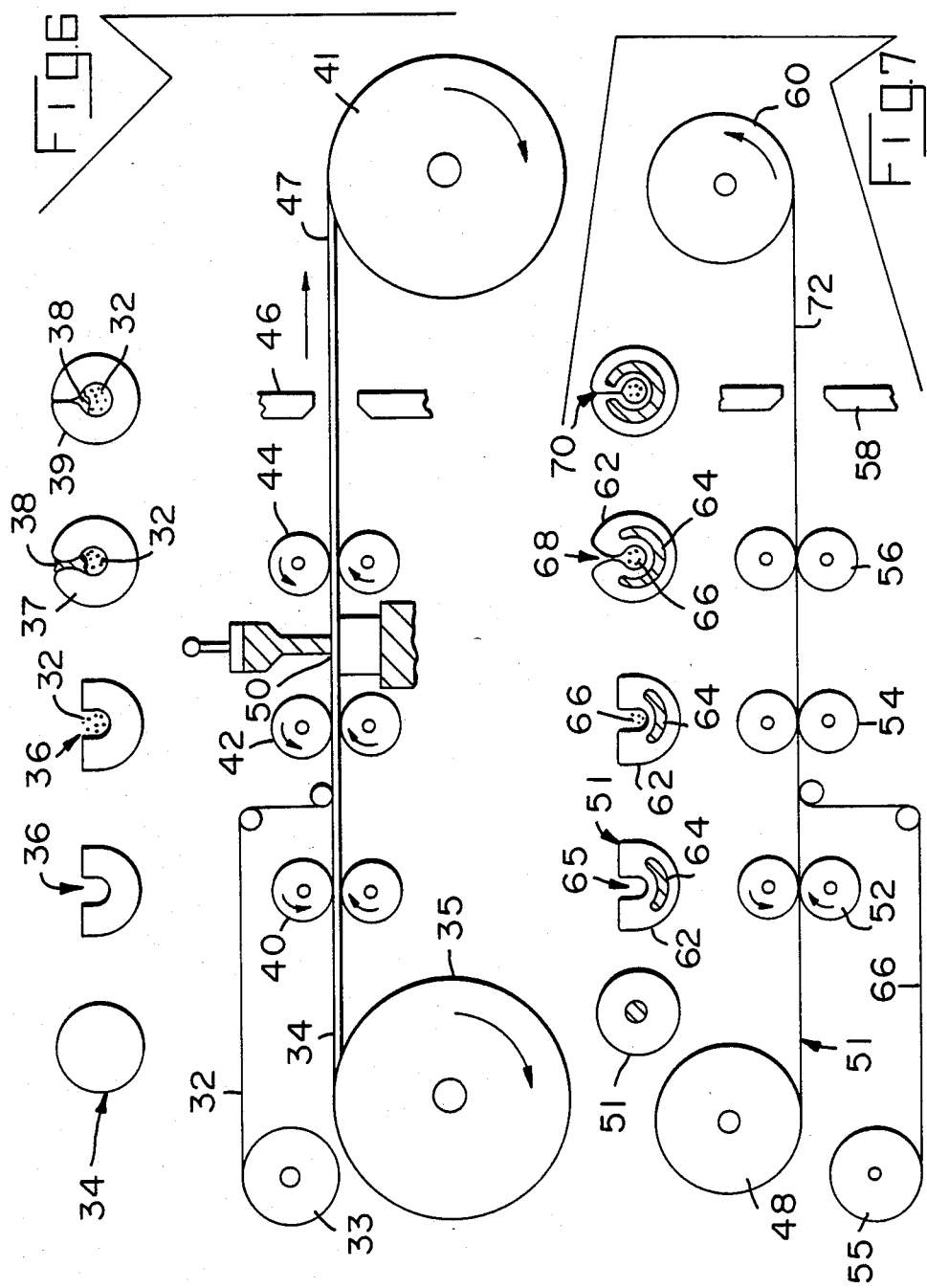

COMPLIANT INTERCONNECTION AND METHOD THEREFOR

BACKGROUND OF THE INVENTION

This invention relates, generally, to a surface mounting device and more particularly to a device and method for compliant interconnection between a substrate and a surface mounting device through the use of an interposer.

As a result of lowering assembly cost, surface mounting devices are being utilized more and more frequently. However, if a ceramic chip carrier or the like is directly soldered to a printed circuit board, problems may occur due to the large coefficient of expansion mismatching between the ceramic and the printed circuit board. Additionally, due to the nonsymmetrical structure of printed circuit boards, they have a tendency to undergo a deformation with the result that "potato-chipping" occurs with the curvature of the printed circuit board changing with temperature and time. When solder is utilized to attach the chip carrier or the like to the printed circuit board, columns of solder couple the two components together. These columns are short and therefore elongation or elastic properties of the columns are poor, with the result that the interface is readily susceptible to cracking. Two types of devices which may utilize surface mounting in conjunction with solder may be found in U.S. Pat. No. 4,268,102 "Low Impedance Electrical Connecting Means for Spaced-Apart Conductors" issued May 19, 1981 to Grabbe, and U.S. Pat. No. 4,155,615 "Multi-Contact Connector for Ceramic Substrate Packages and the Like" issued May 22, 1979 to Zimmerman, Jr., et al.

Accordingly, it is desirable to create a higher solder pedestal so that substantial compliance will be available to compensate for thermal coefficient of expansion mismatch or "potato-chipping". It is also desirable to have this pedestal utilized as an interposer, that is between a substrate and a component, being relatively inexpensive to utilize as well as manufacture and not requiring significant additional or different steps than previous methods. Such a device is taught in the present invention.

Accordingly, and as a further object of the present invention there is described a device for compliantly attaching a connector to a substrate, comprising a substrate having at least one conductive strip thereon, an electrical connector housing disposed on the substrate and having at least one electrical contact disposed therein, wherein the electrical contact has a pad in opposing relationship to the conductive strip and an interposer is disposed between the substrate and the electrical connector housing, with the interposer being comprised of a nonconductive carrier having at least one interconnect area disposed therein and an interconnect area is disposed between a conductive pad and a corresponding conductive strip, and further characterized by at least one wire having solder or the like thereon such that upon soldering, the solder and wire form a compliant electrical interconnection between a conductive pad and a corresponding strip. Another object of the present invention is for a method for compliantly interconnecting an electrical component or connector to the substrate, comprising the steps of: (a) placing the interposer onto the substrate such that the interconnect areas are in alignment with corresponding conductive strips on the substrate; (b) placing the electrical connector adjacent the interposer such that portions of the electrical contacts in the connector are in alignment with a corresponding interconnect area in the interposer; and (c) heating the interconnect areas so as to form a soldered connection between the conductive pads and the corresponding conductive strips.

BRIEF DESCRIPTION OF THE DRAWINGS

Reference is now made to the accompanying drawings in which:

FIGS. 1A, 1B and 1C are a schematic representation of the prior art;

FIG. 2 is an illustrative partly exploded isometric view of the interposer to be used with the present invention;

FIGS. 6 and 7 indicate alternate methods of making interconnect wire which is utilized in the interposer of the present invention.

DESCRIPTION OF THE PREFERRED EMBODIMENT

Figure 3:
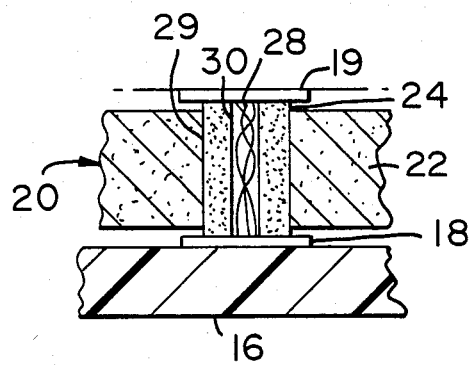
FIGS. 3 and 4 show in cross section the use of the interposer before and after soldering, respectively.

Reference is now made to FIGS. 1A, 1B and 1C which are schematic representations of the prior art. Heretofore, a substrate 10 was utilized having a trace 13 thereon thereby forming a printed circuit board. Typically, surface mounting is performed using three different variations. The first, as shown in FIG. 1A, is where pure solder is deposited adjacent the sides of the surface mounting device with the surface mounting device typically having a chip 11 disposed thereon. A second typical method, as shown in FIG. 1B, is where a pure solder column is disposed in between the surface mounting device and the traces 13. A third method is the use of solder and wire, as shown in FIG. 1C, where wires are spirally wound around the outside of solder and is used in between the surface mounting device and the traces. Thereafter, during soldering a pure solder column, as shown in FIGS. 1A and 1B, is formed due to the surface tension of the solder in conjunction with capillary action. Accordingly, when the substrate 10 experiences "potato-chipping" or the coefficient of thermal expansion between the surface mounting device 12 and the substrate 10 are mismatched, the solder 15 is subject to breaking. As to the type shown in FIG. 1C, there are a number of practical problems such as physical positioning of the solder and wire spiral 17 as well as the flux which is generally contained inside the solder being physically separated from the wire. All of the types of mounting shown in FIGS. 1A, 1B and 1C may cause an extraordinary amount of difficulty when a surface mounting device having a large number of pads, typically 64 or more, experiences electrical discontinuity due to the soldering. Accordingly, it has been found that the present invention overcomes all of the difficulties experienced in the prior art.

Referring now to FIG. 2, there can be seen an isometric partly exploded view of the present invention. Shown is a printed circuit board 16 having conductive strips or traces 18 thereon. An interposer is shown generally at 20. The interposer 20 is comprised of a "paper" 22 and interconnect areas 24 (described more fully below). A surface mounting device is shown generally at 25 and is comprised of a plurality of pins, pads, terminals or the like 19 therein (not shown). It is to be understood, however, that the type of device which may be surface mounted may vary from the device shown without departing from the spirit and scope of the present invention may include, for example, chip carriers, or other types of devices.

Figure 3A:
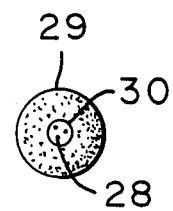
FIG. 3a is a top view of FIG. 3.
Figure 4:
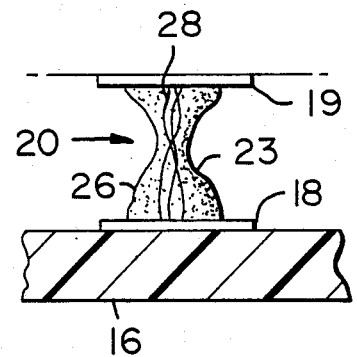

Referring now to FIGS. 3 and 3A, there is shown in more detail the interposer 20 of the present invention. The interposer 20 as mentioned previously is comprised of a carrier which is "paper" 22 and which in the preferred embodiment of the present invention is water soluble such as the type produced by Mishima Paper Manufacturing Company Ltd. of Japan and called "Dissolvo". Disposed in the paper is the interconnect area 24 (which could also be considered a wick or pedestal) which is preferably comprised of solder 29 having disposed therein strands of copper wire 28 having flux 30 therearound, the manufacture of which is disclosed below. Therefore when used, a sheet of the interposer 20 is placed on top of the PC board 16 and in a preferred embodiment is in a strip form thereby having a plurality of interconnect areas 24 which are properly aligned and spaced in the paper 22 (as shown in FIG. 2). Thereafter, the surface device 25 which might also be a chip carrier or a large scale integration (LSI) device or the like is placed on the interposer 20. Heat is then applied, preferably through vapor phase soldering techniques which are readily known by one skilled in the art. This results in the melting of the solder and hence produces the structure, as shown in FIG. 4. Additionally upon heating, the flux 30 will exude out and clean the surfaces with which it comes into contact, with the solder 26 then going to the larger area through surface tension and capillary action. In this manner, the solder 26 melts into a column 23 which is relatively narrow in the middle, the wires 28 act as a compliant conductive agent providing a path for electrical current directly from the conductive strip 18 to the contact pad 19. Thereafter, should "potato-chipping" or coefficient of expansion mismatching occur, this resilient or compliant interconnection will automatically compensate for it. After the soldering operation, the paper 22 is preferably totally removed by washing since the preferred paper is completely water soluble. In the preferred embodiment of the present invention, the interconnect areas 24 are more narrow than the strips 18 or the pads 19 so as to prevent an overflow of solder. The interconnect areas 24, however, may be of other configurations such as a square or rectangle while single wires may be utilized which may be of materials other than copper such as aluminum or any other suitable electrically conductive material.

Figure 5:
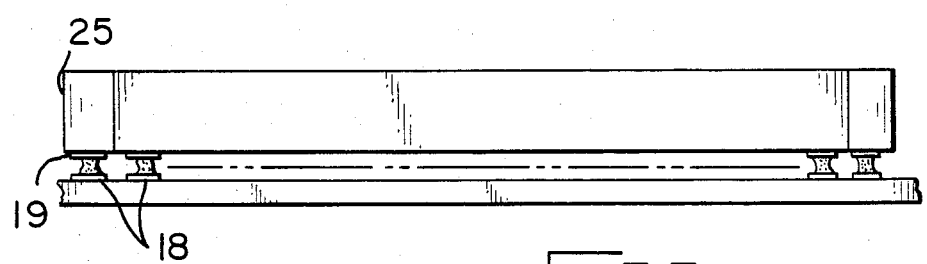
FIG. 5 is an exaggerated side view of the present invention as utilized.

Referring now to FIG. 5, there is shown a slightly exaggerated side view of an assembly using the present invention showing the interposer 20 disposed between the surface mounting device 25 and the PC board 16.

In the preferred embodiment of the present invention, the interconnect areas or pedestals 24 are made in a long continuous fashion in one of two different ways as schematically shown in FIGS. 6 and 7. Since the types of operations as shown in FIGS. 6 and 7 are generally known to one skilled in the art, only a brief description may accordingly be found below. Referring now to FIG. 6, there is shown wire 32 and pure solder 34 being taken off the wire take-off spool 33 and the solder take-off spool 35 respectively. The solder 34 passes through forming wheels 40 thereby forming a roll groove 36 in the solder. Thereafter at the forming wheels 42, the wire 32 is inserted into the roll groove 36 of the solder 34. With the wire 32 still exposed in the roll groove 36, flux 38 is placed into the roll groove 36 over the wire 32 by the flux injector 50. After the flux 38 has been placed into the roll groove 36, forming wheels at 44 begin to form a partly closed roll at 37. Thereafter at the draw-through dies shown at 46, the solder 34 is closed over the wire and flux 32, 38 respectively thereby forming a closed roll 39 and thereby essentially forming a complete interconnect wire assemblage 47. This assemblage 47 is then placed onto an interconnect wire take-up spool at 41 for use in the interposer 20 (not shown) as described more fully below.

Referring now to FIG. 7, another manner in forming the interconnect wire of the present invention is disclosed. A solder having flux in it 51 is taken off a flux/solder take-off spool 48 and is thereafter passed through forming wheels 52 thereby forming a roll groove 65 therein. Thereafter wire 66 which is taken off the wire take-off spool 55 is deposited or placed into the roll groove 65. Forming wheels 56 thereafter close the solder 62 and flux 64 around the wire 66 so as to form a partly closed roll 68. Dies 58 form a closed roll at 70 thereby forming interconnect wire 72 which is taken up onto the interconnect wire take-up spool 60 and would thereafter be used with the interposer 20 (not shown). Thereafter, the continuous spools of interconnect wires 47, 72 are cut into the appropriate length which is then inserted into the paper 22 of the interposer 20 at the appropriate spacing thereby forming the interposer 20. Further, the interposer 20 itself may also be made into continuous spool which is then cut into the desired length for the connector for which it is to be used.

It is to be remembered that many variations may be practiced without departing from the spirit and scope of the present invention. These variations may include different types of housing arrangements and different types of pins or terminals and may simply be conductive pads as is commonly found on chip carriers. Also, different methods of forming interconnect wires other than those shown may be used. Further, materials other than paper may be utilized such as RTV and which may or may not be removed. Additionally, the present invention may be utilized with plate through-holes on a printed circuit board. Also, flux may be eliminated while the ratio and size of the interconnect area to the strip or pad to which it is connecting may vary.

Accordingly, the disclosed invention produces a method and device for compliant interconnection which is relatively inexpensive and simple to practice and which minimizes coefficient of expansion and/or mismatching problems as well as problems associated with "potato-chipping".

What is claimed is:

1. A device for compliantly attaching a component/connector to a substrate, comprising:
   a substrate having at least one conductive strip thereon;
   an electrical component electrically connected to the substrate, the electrical component having at least one electrical contact disposed therein, the electrical contact having a pad in opposing relationship to the conductive strip of the substrate;
   an interposer disposed between the substrate and the electrical component, the interposer having a non-conductive carrier which has at least one interconnect area disposed therein, the interconnect area being aligned between a conductive pad on the electrical component and a corresponding conductive strip on the substrate;

the interconnect area having wire means for electrically connecting the substrate to the electrical component, solder or the like surrounding the wire means, and means for ensuring a positive electrical connection between the substrate and the electrical component.

2. A device according to claim 1 wherein said substrate is comprised of a printed circuit board.

3. A device according to claim 1 wherein said nonconductive carrier is soluble in water.

4. A device according to claim 1 wherein said interposer is in strip form having a plurality of interconnect areas therein corresponding to the number of conductive strip and conductive pad connections.

5. A device according to claim 1 wherein the electrical component is comprised of an electrical connector.

6. An interposer for compliantly attaching an electrical component to a substrate, the interposer comprising:

a nonconductive carrier having at least one interconnect area disposed therein;

wire means positioned in the interconnect area, the wire means extending from one side of the interconnect area;

solder or the like surrounding the wire means, the solder defining a column through which the wire means extend;

means for ensuring that a positive electrical connection is made, the means positioned in the column around the wire means;

whereby as the interposer is positioned between the substrate and the electrical component heat is applied, causing the means for ensuring positive electrical connection to exude out of the column and clean the respective surfaces on the substrate and electrical component with which it comes in contact, the heat also melts the solder causing the solder to flow about the wire means and secure the substrate to the electrical component.

7. A method for compliantly interconnecting an electrical component or connector having electrical contacts therein with a substrate having conductive strips thereon, comprising the steps of:

a. placing an interposer having a nonconductive soluble carrier with electrically conductive and solderable interconnect areas having flux means therein onto a substrate such that the interconnect areas are in alignment with corresponding conductive strips on the substrate;

b. placing the electrical connector adjacent the interposer such that portions of the electrical contacts in the connector are in alignment with a corresponding interconnect area in the interposer; and c. heating the interconnect areas causing the flux means to clean the conductive strips on the substrate and the electrical contacts in the connector such that a positive electrical soldered connection is formed between the conductive pads and corresponding conductive strips.

8. A method according to claim 7 comprising an additional step, step (d) of removing the nonconductive soluble carrier through the use of an appropriate fluid.

9. A method for compliantly interconnecting an electrical component or connector having electrical contacts therein with a substrate having conductive strips thereon, comprising the steps of:

a. placing an interposer having a nonconductive soluble carrier with electrically conductive and solderable interconnect areas having flux means therein onto a substrate such that the interconnect areas are in alignment with corresponding conductive strips on the substrate;

b. placing the electrical component or connector adjacent the interposer such that portions of the electrical contacts in the component or connector are in alignment with a corresponding interconnect area in the interposer; and c. heating the interconnect areas causing the flux means to clean the conductive strips on the substrate and the electrical contacts in the connector such that a positive electrical soldered connection is formed between the conductive pads and corresponding conductive strips.

* * * * *